United States Patent
Chen et al.

(10) Patent No.: US 10,681,800 B1
(45) Date of Patent: Jun. 9, 2020

(54) THERMAL MODULE MOUNTING STRUCTURE

(71) Applicant: ADLINK TECHNOLOGY INC., New Taipei (TW)

(72) Inventors: Hua-Feng Chen, New Taipei (TW); Chih-Cheng Chou, New Taipei (TW)

(73) Assignee: ADLINK TECHNOLOGY INC., New Taipei (TW)

( * ) Notice: Subject to any disclaimer, the term of this patent is extended or adjusted under 35 U.S.C. 154(b) by 0 days.

(21) Appl. No.: 16/390,481

(22) Filed: Apr. 22, 2019

(51) Int. Cl.
*H05K 1/02* (2006.01)
*H01L 23/40* (2006.01)
*H05K 7/20* (2006.01)

(52) U.S. Cl.
CPC ....... *H05K 1/0203* (2013.01); *H01L 23/4006* (2013.01); *H01L 2023/405* (2013.01); *H01L 2023/4087* (2013.01); *H05K 7/20454* (2013.01)

(58) Field of Classification Search
CPC ......... H05K 1/0201–0203; H01L 23/40–4006; H01L 2023/405; H01L 2023/4068; H01L 2023/4087
See application file for complete search history.

(56) References Cited

U.S. PATENT DOCUMENTS

| | | | | | |
|---|---|---|---|---|---|
| 5,062,016 | A | * | 10/1991 | Zupancic | G06F 1/185 360/99.18 |
| 5,301,179 | A | * | 4/1994 | Okamoto | G11B 17/0438 720/636 |
| 6,046,905 | A | * | 4/2000 | Nelson | G06F 1/184 257/E23.086 |
| 7,133,285 | B2 | * | 11/2006 | Nishimura | H05K 5/0265 361/715 |
| 2015/0144321 | A1 | * | 5/2015 | Kim | H01L 23/4006 165/185 |

* cited by examiner

*Primary Examiner* — Robert J Hoffberg
(74) *Attorney, Agent, or Firm* — Muncy, Geissler, Olds & Lowe, P.C.

(57) ABSTRACT

A thermal module mounting structure includes a thermal module having a first bracket with mounting holes fixedly mounted at each of two opposite sides of a bottom wall thereof, a circuit board having one or multiple heat source components located on a top wall thereof and a second bracket with through holes fixedly mounted at each of two opposite sides of the top wall, and a plurality of fasteners respectively inserted through the through holes of the second brackets and fastened to the respective mounting holes of the first brackets to secure the circuit board to the thermal module in a vertically floatable manner and to keep the heat source components in contact with the bottom wall of the thermal module.

8 Claims, 6 Drawing Sheets

THERMAL MODULE MOUNTING STRUCTURE

BACKGROUND OF THE INVENTION

1. Field of the Invention

The present invention relates to thermal module technology and more particularly, to a thermal module mounting structure, which a thermal module provided with first brackets, a circuit board provided with heat source components and second brackets, and fasteners mounted in the second brackets and fastened to the first brackets to secure the circuit board to the thermal module in a vertically floatable manner and to keep the heat source components in contact with the bottom wall of the thermal module.

2. Description of the Related Art

Following fast development of electronic technology, advanced personal computers, notebooks, tablet computers and many other electronic products have been continuously created and widely used in every corner of the society. It is the market trend to create electronic products having the characteristics of strong computing capabilities, high operating speed and small size. With the open architecture of computer equipment and the standardization of software and hardware, and the continuous expansion and upgrading of functions, industrial computers suitable for various professional fields are born. The main applications of industrial computers include industrial control/automation equipment, network and communication equipment, image detection and identification and intelligent transportation systems. To a higher level, industrial computers can also be used in military, transportation and aerospace fields, and other related industries that require high reliability and stability. Industrial computers are required to meet specific specifications and to perform high-performance operations in harsh environments.

Furthermore, industrial computers include, for example, single board computer (SBC), computer on module (COM), and back plane module (BPM). A computer on module (COM) is a development board with computer processor, chipset, I/O ports, memory, hard disk drive and peripherals designed into a component module, providing expansion slots for plug-and-play (PNP) hardware platforms and additional features. The size of a computer on module (COM) is smaller than a PC motherboard. Computer on module (COM) is more flexible in a variety of fixed and mobile embedded systems and industrial applications. However, due to its small size and fast operation, computer on module (COM) accumulates more heat than a typical motherboard and requires a better heat dissipation structure.

Conventional computer on modules (COMs) often use a thermal interface material (TIM) as a thermal pad. The role of the thermal pad is to transfer waste heat generated by the central processing unit or the chip to the copper block and the thermal module during operation. Because the thermal pad is used as the thermal interface material, its thermal resistance is larger than that of thermal paste. In addition, the thermal module is fixed on the circuit board, and the locking method is not an elastic structure. However, in order to avoid chip damage caused by vibration or overpressure, a thermal pad with stress buffering and assembly tolerance absorption functions is still needed. As a result, the thermal resistance between the central processor and the thermal module cannot be reduced, which affects the operational efficiency.

Because of the great shortcomings of the above heat dissipation structure, it is necessary to develop an improved design.

SUMMARY OF THE INVENTION

The present invention has been accomplished under the circumstances in view. It is therefore one object of the present invention to provide a thermal module mounting structure, which comprises a thermal module, a plurality of first brackets respectively affixed to at least two opposite sides of the bottom wall of the thermal module and respectively provided with a plurality of mounting holes, a circuit board carrying at least one heat source component, a plurality of second brackets respectively affixed to at least two opposite sides of the top wall of the circuit board and respectively provided with a plurality of through holes, and a plurality of fasteners respectively inserted through the through holes of the second brackets and fastened to the mounting holes of the first bracket to secure the circuit board to the thermal module in a vertically floatable manner while keeping the at least one heat source component in close contact with the bottom wall of the thermal module. This mounting structure avoids the occurrence of component damage due to vibration or overpressure, achieving both flexibility and vibration absorption.

It is another object of the present invention to provide a thermal module mounting structure, which further comprises a screw mount provided between the thermal module and the circuit board, and a plurality of elastic fastening devices fastened to the screw mounts to secure the circuit board to the thermal module. The screw mount is affixed to the bottom wall of the thermal module, comprising a plurality of screw seats. The elastic fastening devices are respectively inserted through respective through holes on the circuit board and fastened to respective screw seats of the screw mount to form an elastic buffer structure between the thermal module and the circuit board.

It is still another object of the present invention to provide a thermal module mounting structure, which further comprises at least one heat transfer element mounted between the at least one heat source component of the circuit board and the thermal module, and a thermal paste or phase change material provided between the top surface of each heat source component and the at least one heat transfer element.

Other advantages and features of the present invention will be fully understood by reference to the following specification in conjunction with the accompanying drawings, in which like reference signs denote like components of structure.

DETAILED DESCRIPTION OF THE PREFERRED EMBODIMENT

Figure 1:
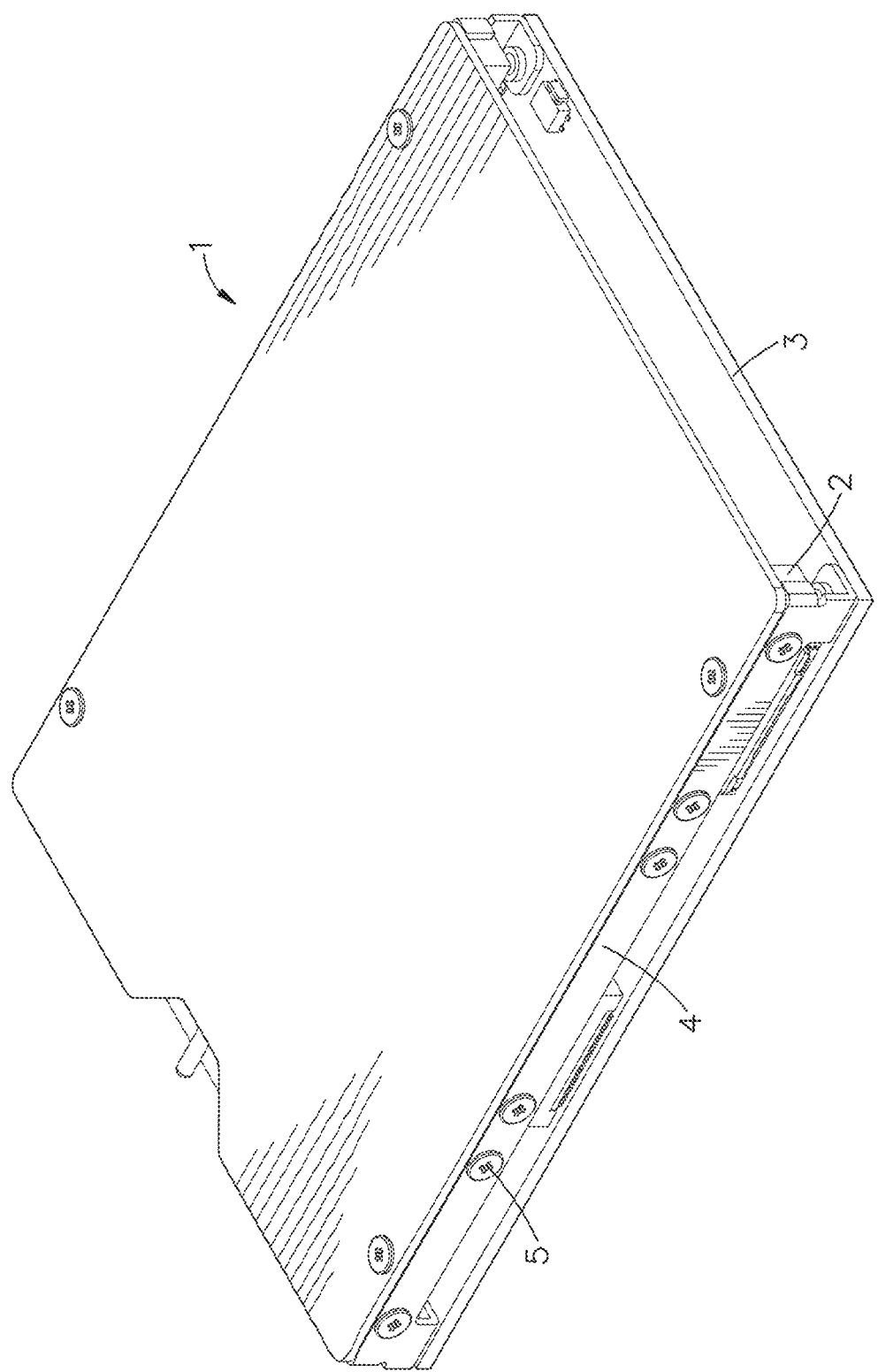
FIG. 1 is an oblique top elevational view of a thermal module mounting structure in accordance with the present invention.
Figure 2:
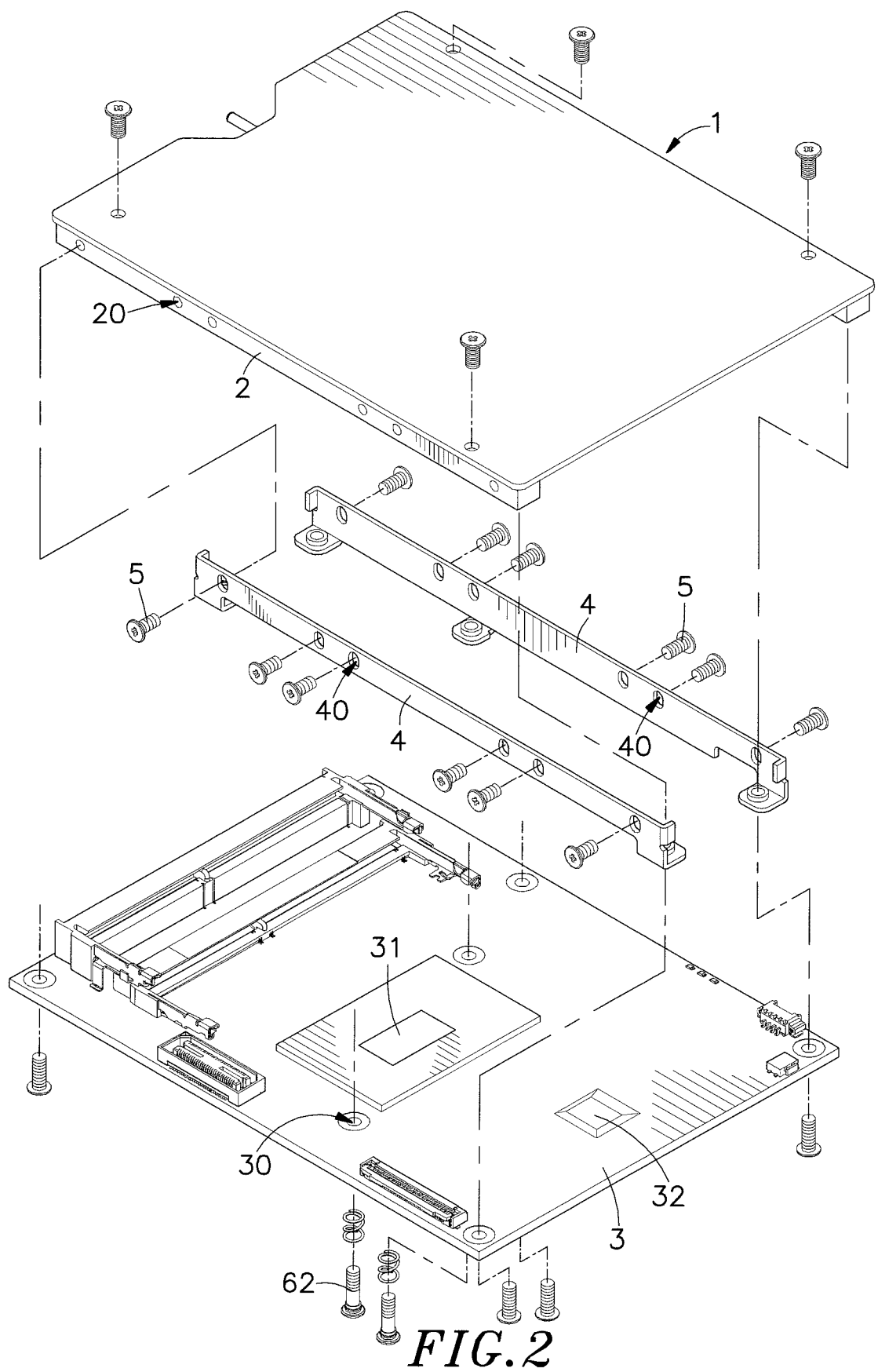
FIG. 2 is an exploded view of the thermal module mounting structure in accordance with the present invention.
Figure 3:
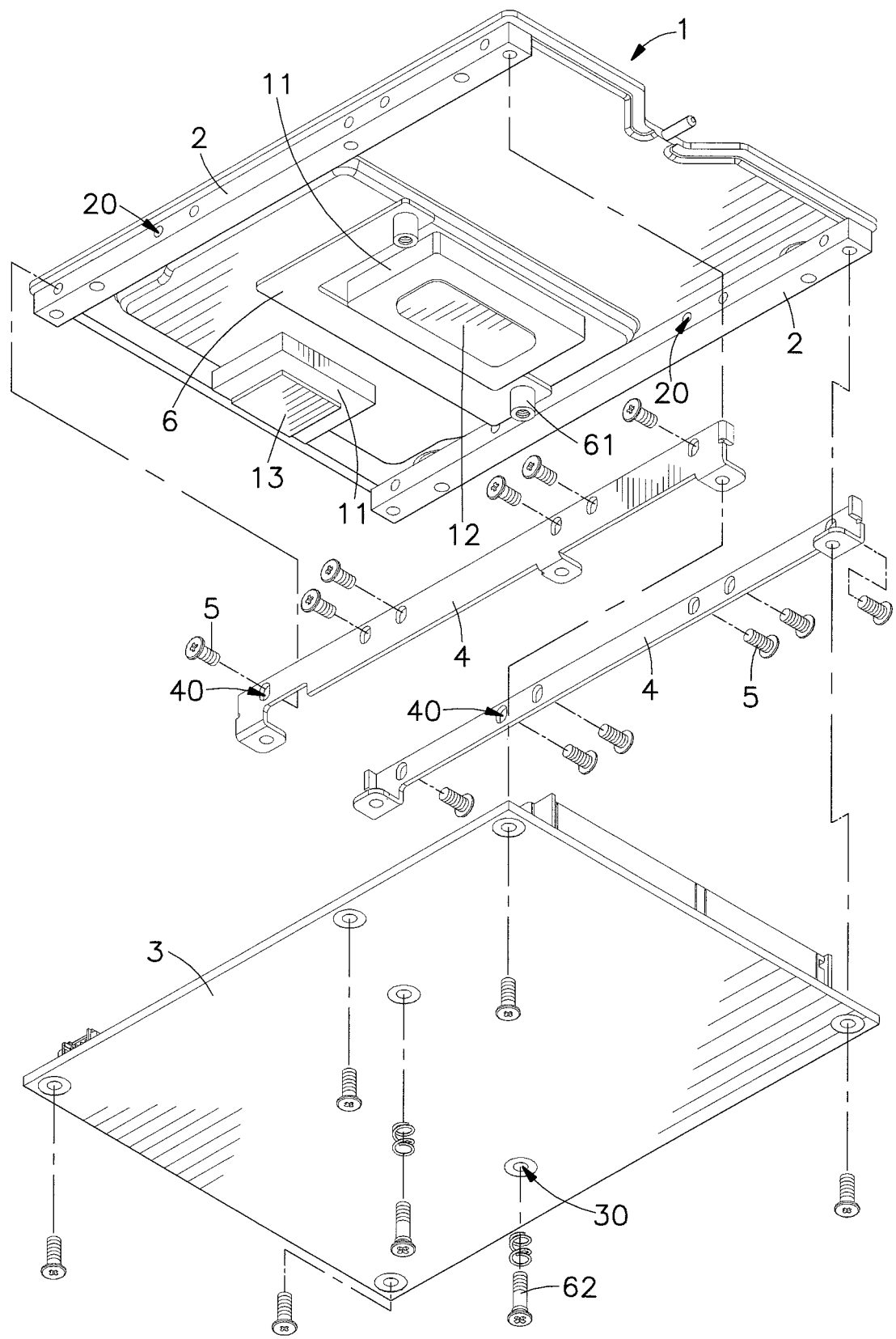
FIG. 3 corresponds to FIG. 2 when viewed in another angle.
Figure 4:
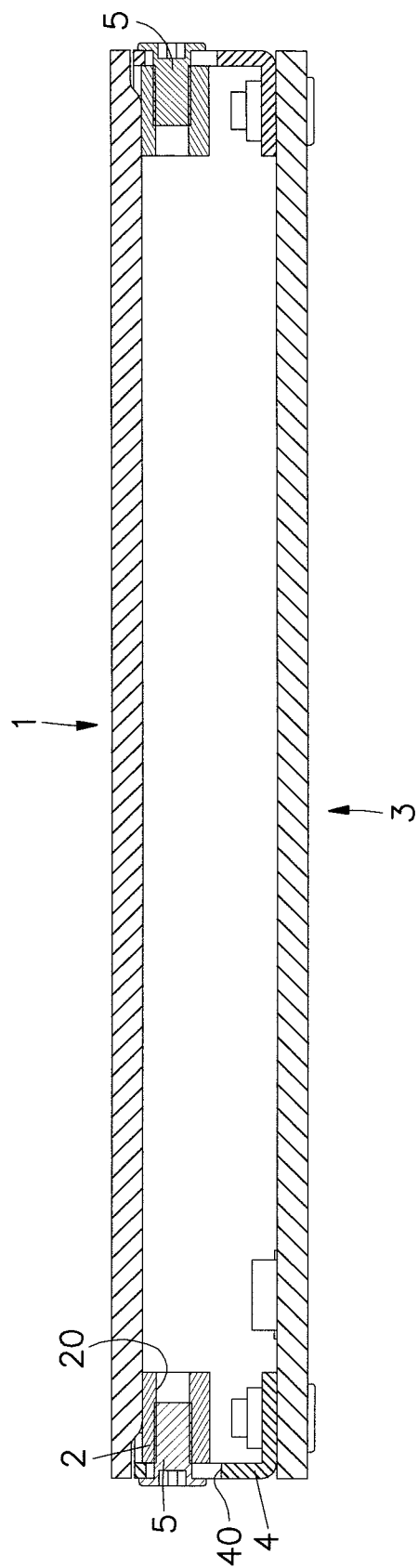
FIG. 4 is a sectional side view of the thermal module mounting structure in accordance with the present invention.
Figure 5:
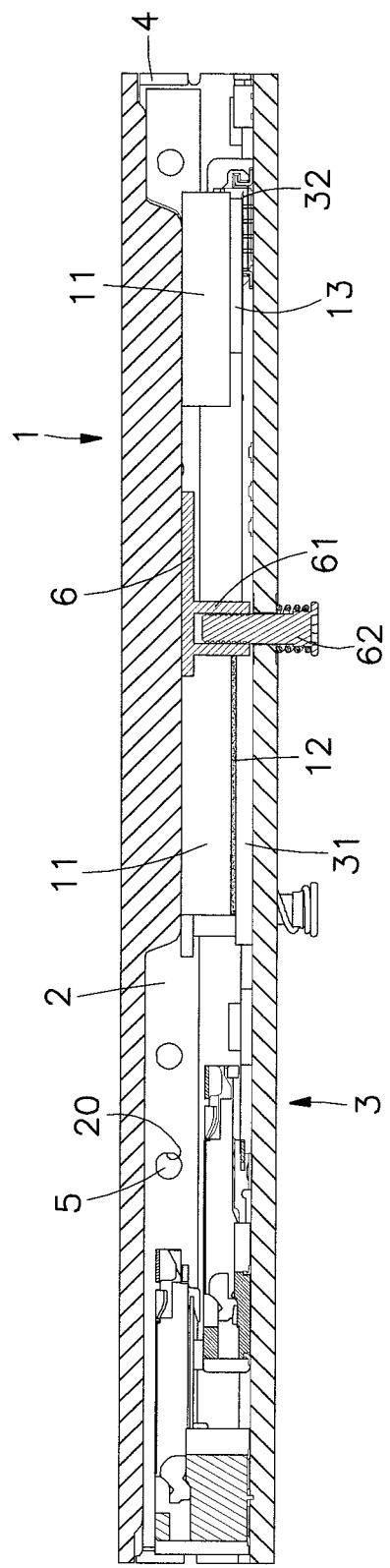
FIG. 5 is another sectional side view of the thermal module mounting structure in accordance with the present invention.
Figure 6:
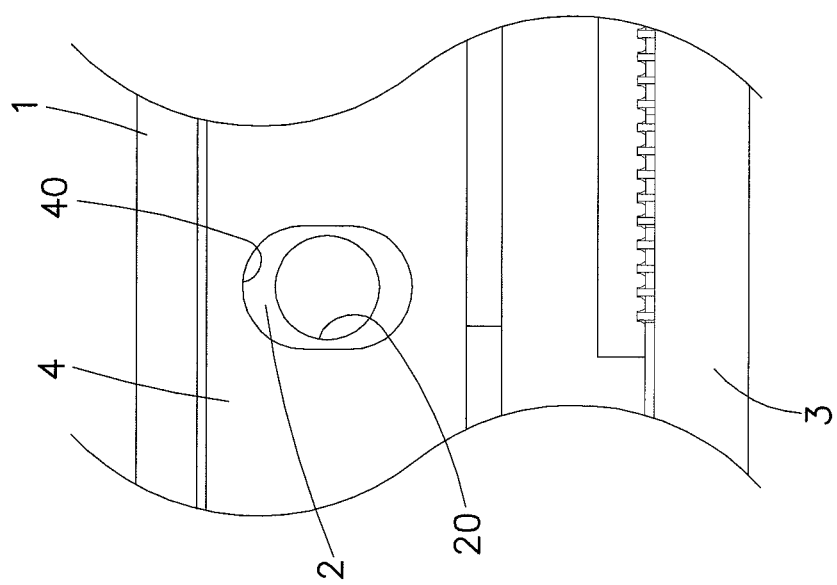
FIG. 6 is a schematic drawing illustrating floating positioning arrangement between the first brackets and the second brackets.

Please refer to FIGS. 1-6, in which FIG. 1 is an oblique top elevational view of a thermal module mounting structure in accordance with the present invention, FIG. 2 is an exploded view of the thermal module mounting structure, FIG. 3 corresponds to FIG. 2 when viewed from another angle, FIG. 4 is a sectional side view of the thermal module mounting structure, FIG. 5 is another sectional side views of the thermal module mounting structure, and FIG. 6 is a schematic drawing illustrating floating positioning arrangement between the first brackets and the second brackets. The thermal module mounting structure comprises a thermal module 1, at least one pair of first brackets 2, a circuit board 3, at least one pair of second brackets 4, a plurality of fasteners 5 and a screw mount 6. The connection relationship of these component parts are as follows:

The thermal module 1 has at least two opposite sides of a bottom wall thereof respectively mounted with one first bracket 2. In the present preferred embodiment, two first brackets 2 are respectively affixed to two opposites sides of the bottom wall of the thermal module 1. In another embodiment of the present invention, another two first brackets 2 can be additionally and respectively affixed to another two opposite sides of the bottom wall of the thermal module 1. Each first bracket 2 has a plurality of mounting holes 20. The thermal module 1 can be a vapor chamber (VC) or heat sink.

The circuit board 3 includes at least one heat source component. In the present preferred embodiment, the circuit board 3 includes a first heat source component 31 and a second heat source component 32. The first heat source component 31 and the second heat source component 32 can be respectively, a central processing unit (CPU), or a chipset that is easy to generate heat, such as: north and south chipset or power supply chipset. The circuit board 3 has at least two opposite sides of a top wall thereof respectively mounted with one second bracket 4. In the present preferred embodiment, two second brackets 4 are respectively affixed to two opposites sides of the top wall of the circuit board 3. In another embodiment of the present invention, another two second brackets 4 can be additional and respectively affixed to another two opposite sides of the top wall of the circuit board 3. Each second bracket 4 has a plurality of through holes 40. These through holes 40 are oval through holes. These second brackets 4 are respectively attached to the first brackets 2 at the thermal module 1 at an outer side to keep the respective mounting holes 20 of the first brackets 2 in alignment with the respective through holes 40 of the second bracket 4. The fasteners 5 are respectively inserted through the through holes 40 and fastened to the respective mounting holes 20 to secure the circuit board 3 to the thermal module 1 and to keep the first heat source component 31 and the second heat source component 32 in abutment against a bottom wall of the thermal module 1, allowing the through holes 40 of the second bracket 4 to be moved vertically with the circuit board 3 relative to the thermal module 1 within a predetermined distance, i.e., in a floating positioning manner (see FIG. 6).

Further, at least one heat transfer element 11 is provided between the first heat source component 31 and second heat source component 32 of the circuit board 3 and the thermal module 1. The heat transfer element 11 is preferably a copper block. The thickness of the copper block can be adjusted according to the gap between the thermal module 1 and the first heat source component 31 and second heat source component 32 of the circuit board 3. The heat transfer element 11 has one side thereof abutted to the bottom wall of the thermal module 1, and an opposite side abutted to the top surface of each of the first heat source component 31 and second heat source component 32 of the circuit board 3. A thermal paste 12 or a phase change material 13 can be provided between the heat transfer element 11 at the thermal module 1 and the top surface of each of the first heat source component 31 and second heat source component 32 of the circuit board 3. The phase change material 13 is a heat-deformable polymer (non-silicone). It is a flexible solid at room temperature. It has adhesiveness and non-conductivity. When it is heated to the phase change temperature of the material, it will soften to form a paste that can fill the gap between the heat source components 31,32 and the thermal module 1 to improve the thermal conductivity, so the phase change material 13 can replace the thermal paste 12 to transfer heat.

The screw mount 6 is mounted between the thermal module 1 and the circuit board 3. The screw mount 6 is affixed to the bottom wall of the thermal module 1, having a plurality of screw seats 61 for the fastening of respective elastic fastening devices 62. These elastic fastening devices 62 are respectively inserted through respective through holes 30 on the circuit board 3 and fastened to the respective screw seats 61, forming an elastic buffer structure between the thermal module 1 and the circuit board 3. The elastic fastening devices 62 in the present preferred embodiment are spring-loaded screws.

When going to assemble the thermal module 1 with the circuit board 3, fixedly mount the heat transfer element 11 to the bottom wall of the thermal module 1 at first, then coat the surface of the heat transfer element 11 with a thermal paste or bond a phase change material to the surface of the heat transfer element 11, and then affix the screw mount 6 to the bottom wall of the thermal module 1, and then affix a first bracket 2 to each of two opposite sides of the bottom wall of the thermal module 1, and then affix a second bracket 4 to each of two opposite sides of the top wall of the circuit board 3, and then attach these two second brackets 4 to the respective first brackets 2 at the thermal module 1 to keep the mounting holes 20 of the first brackets 2 in alignment with the respective through holes 40 of the second brackets 4, and then fasten the respective fasteners 5 to the respective through holes 40 and the respective mounting holes 20 to secure the circuit board 3 to the thermal module 1 in a vertically floatable manner while keeping the first and second heat source components 31,32 in close contact with the bottom wall of the thermal module 1, and then insert the respective elastic fastening devices 62 through the respective through holes 30 of the circuit board 3 and fasten the respective elastic fastening devices 62 to the respective screw seats 61 of the screw mount 6. Thus, the thermal module 1 with the circuit board 3 are well assembled. This mounting structure avoids the occurrence of chip damage (referred to as the first and second heat source components 31,32) due to vibration or overpressure, achieving both flexibility and vibration absorption.

The invention can be understood as a thermal module mounting structure by the disclosure of the first to sixth figures, which generally comprises a thermal module, a plurality of first brackets respectively affixed to at least two opposite sides of the bottom wall of the thermal module and respectively provided with a plurality of mounting holes, a circuit board carrying at least one heat source component, a plurality of second brackets respectively affixed to at least two opposite sides of the top wall of the circuit board and respectively provided with a plurality of through holes, and a plurality of fasteners respectively inserted through the through holes of the second brackets and fastened to the mounting holes of the first bracket to secure the circuit board to the thermal module in a vertically floatable manner while keeping the at least one heat source component in close contact with the bottom wall of the thermal module. This mounting structure avoids the occurrence of component damage due to vibration or overpressure, achieving both flexibility and vibration absorption. The invention solves the problem of the conventional designs that the thermal resistance between the central processor and the thermal module cannot be reduced and thus affects its performance, and has good practicability, so the patent application is filed to seek the protection of the patent right.

Although a particular embodiment of the invention has been described in detail for purposes of illustration, various modifications and enhancements may be made without departing from the spirit and scope of the invention. Accordingly, the invention is not to be limited except as by the appended claims.

What the invention claimed is:

1. A thermal module mounting structure, comprising:
   a thermal module comprising a plurality of first brackets, a representative one of said first brackets fixedly mounted at each of at least two opposite sides of a bottom wall thereof, each of said first brackets comprising a plurality of mounting holes;
   a circuit board comprising at least one heat source component located on a top wall thereof and a plurality of second brackets, a corresponding one of said second brackets fixedly mounted at each of at least two opposite sides of the top wall, each of said second brackets having a plurality of through holes corresponding to respective ones of said mounting holes of the respective one of said first brackets, said second brackets being respectively attached to the respective one of said first brackets of said thermal module at an outer side of the respective one of said first brackets;
   a plurality of fasteners respectively inserted through said through holes of said second brackets and fastened to the respective one of said mounting holes of said first brackets to secure said circuit board to said thermal module in a vertically floatable manner and to keep said at least one heat source component in thermally coupled to the said bottom wall of said thermal module; and
   a plurality of screw mounts provided between said thermal module and said circuit board and a plurality of elastic fastening devices fastened to said screw mounts to secure said circuit board to said thermal module, said screw mounts being affixed to the said bottom wall of said thermal module and comprising a plurality of screw seats, said elastic fastening devices being respectively inserted through a corresponding one of said through holes of said circuit board and fastened to a respective one of said screw seats of said screw mounts to form an elastic buffer structure between said thermal module and said circuit board.

2. The thermal module mounting structure as claimed in claim 1, wherein said elastic fastening devices are spring-loaded screws.

3. The thermal module mounting structure as claimed in claim 1, further comprising at least one heat transfer element mounted between said at least one heat source component of said circuit board and said thermal module, each of said heat transfer element having one side thereof abutted against the bottom wall of said thermal module and an opposite side thereof facing and thermally coupled to a top surface of each of said at least one heat source component.

4. The thermal module mounting structure as claimed in claim 3, further comprising a thermal paste or a phase change material provided between the top surface of each of said at least one heat source component and said at least one heat transfer element.

5. The thermal module mounting structure as claimed in claim 3, wherein each of said at least one heat transfer element is a copper block.

6. The thermal module mounting structure as claimed in claim 1, wherein the said through holes of said second brackets are oval through holes.

7. The thermal module mounting structure as claimed in claim 1, wherein said thermal module is a vapor chamber or a heat sink.

8. The thermal module mounting structure as claimed in claim 1, wherein each of said at least one heat source component is a central processing unit or a chipset.

* * * * *